US008148790B2

(12) United States Patent
Morris, III et al.

(10) Patent No.: US 8,148,790 B2
(45) Date of Patent: Apr. 3, 2012

(54) THIN-FILM LID MEMS DEVICES AND METHODS

(75) Inventors: Arthur S. Morris, III, Raleigh, NC (US); Li Sun, Lake Forest, CA (US); Norlito Baytan, Riverside, CA (US)

(73) Assignee: Wispry, Inc., Irvine, CA (US)

( * ) Notice: Subject to any disclaimer, the term of this patent is extended or adjusted under 35 U.S.C. 154(b) by 447 days.

(21) Appl. No.: 12/499,703

(22) Filed: Jul. 8, 2009

(65) Prior Publication Data
US 2010/0032775 A1 Feb. 11, 2010

Related U.S. Application Data

(60) Provisional application No. 61/134,217, filed on Jul. 8, 2008.

(51) Int. Cl.
*H01L 29/84* (2006.01)
*H01L 21/00* (2006.01)
(52) U.S. Cl. ......... 257/415; 257/E23.125; 257/E23.002; 257/E21.705
(58) Field of Classification Search .................. 257/415, 257/E23.125, E23.002, E21.705; 438/51
See application file for complete search history.

(56) References Cited

U.S. PATENT DOCUMENTS

| 6,635,509 | B1 | 10/2003 | Ouellet |
| 2002/0183013 | A1 | 12/2002 | Auckland et al. |
| 2003/0217915 | A1 | 11/2003 | Ouellet et al. |
| 2005/0085016 | A1 | 4/2005 | McWilliams et al. |
| 2005/0087861 | A1* | 4/2005 | Burtzlaff et al. ............... 257/704 |
| 2005/0095835 | A1* | 5/2005 | Humpston et al. ............ 438/613 |
| 2005/0164647 | A1 | 7/2005 | Shamsaifar |
| 2006/0065961 | A1* | 3/2006 | Chiu et al. ..................... 257/680 |
| 2007/0190680 | A1* | 8/2007 | Fukuda et al. .................. 438/50 |
| 2007/0199822 | A1 | 8/2007 | Bang |
| 2007/0235501 | A1 | 10/2007 | Heck |
| 2009/0134492 | A1* | 5/2009 | Morris et al. ................. 257/532 |
| 2009/0134513 | A1* | 5/2009 | Qiu ............................... 257/734 |

(Continued)

FOREIGN PATENT DOCUMENTS
KR 10-2005-0069746 7/2005

OTHER PUBLICATIONS

International Search Report and Written Opinion for PCT International No. PCT/US2009/049959 dated Mar. 3, 2010.

(Continued)

*Primary Examiner* — Evan Pert
(74) *Attorney, Agent, or Firm* — Jenkins, Wilson, Taylor & Hunt, P.A.

(57) ABSTRACT

Thin film encapsulation devices and methods for MEMS devices and packaging are provided. For a MEMS device encapsulated by a sacrificial layer, a lid layer can be deposited over the MEMS device without touching the MEMS device. The lid layer can be patterned and etched with a distribution of release etch holes, which provide access to the sacrificial layer encapsulating the MEMS device. The sacrificial material can be removed through the release etch holes, and the release etch holes can be filled with a seal layer. The seal layer can be removed from the substrate except where it seals the etch holes, leaving a series of plugs that can prevent other materials from entering the MEMS device cavity. In addition, a seal metal layer can be deposited and patterned so that it covers and encloses the plugged etch holes, and a barrier layer can cover the entire encapsulation structure.

24 Claims, 7 Drawing Sheets

U.S. PATENT DOCUMENTS

2010/0213068 A1* 8/2010 Bang .............................. 205/67

OTHER PUBLICATIONS

International Search Report and Written Opinion for PCT International No. PCT/US2009/041959 dated Aug. 3, 2009.

Nishio, Masaki et al. "A Study of Wideband Built-in Antenna using RF-MEMS Variable Capacitor for Digital Terrestrial Broadcasting" IEEE Antennas and Propagation Society International Symposium 2006, Jul. 9-14, 2006.

* cited by examiner

THIN-FILM LID MEMS DEVICES AND METHODS

RELATED APPLICATIONS

The presently disclosed subject matter claims the benefit of U.S. Provisional Patent Application No. 61/134,217, filed Jul. 8, 2008, the disclosure of which is incorporated herein by reference in its entirety.

TECHNICAL FIELD

The subject matter disclosed herein relates generally to microelectromechanical systems (MEMS) packaging. More particularly, the subject matter disclosed herein relates to wafer-level thin film encapsulation devices and methods for MEMS devices.

BACKGROUND

Microelectromechanical systems (MEMS) devices can be incorporated into a wide variety of technical applications, including sensors (e.g., accelerometers, rate gyros, tilt sensors, thermal), optics (e.g., infrared detectors, optical mirrors), and RF systems (e.g., switches, tunable capacitors, varactors, resonators, and other systems). Such MEMS devices can be made of a single material, such as silicon, polysilicon, silicon nitride, copper, aluminum, or of multiple materials, such a bilayer of polysilicon and gold or a trilayer of aluminum, oxide, and aluminum. In such multilayer applications, the multiple layers can include cladding layers, diffusion barriers, and adhesion layers.

Figure 1:
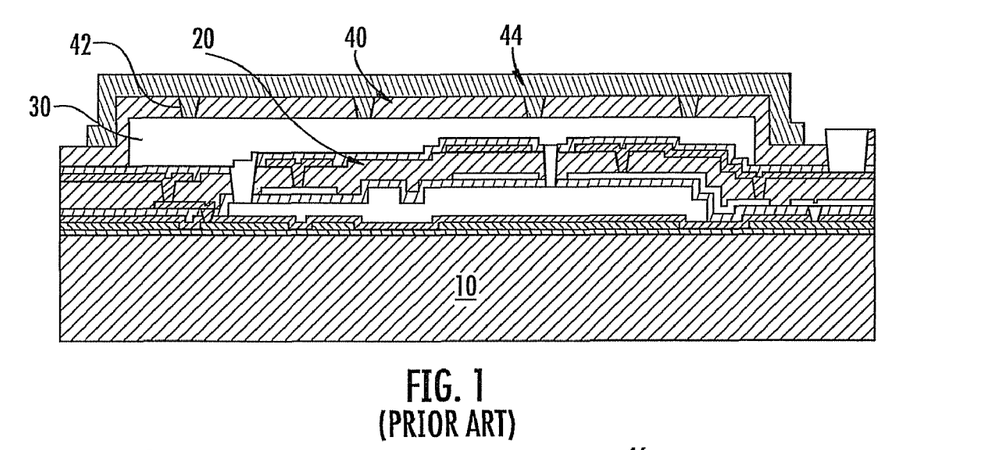
FIGS. 1 and 2 are schematic side views of configurations for a thin film encapsulation according to the prior art.

Current wafer-level thin film encapsulation often consists of two or three layers or films. For example, FIG. 1 shows a two-layer structure. A first layer 40, a structural layer, generally consists of a dielectric material with etching vias 42 that are used to release the MEMS device 20 from within a sacrificial layer. The thickness of structural layer 40 is typically 2-4 μm. Once the sacrificial layer is removed, leaving a cavity 30, a second layer 44 is added. This second layer 44, a sealing layer, generally consists of a polymer that is used for plugging etching vias 42 after MEMS device 20 is released. For good sealing and environmental performance (i.e., hermeticity), second layer 44 will often be non-organic and hydrophobic. This layer is deposited in a vacuum chamber that also deposits some material inside the cavity and results in a very low-pressure environment within the sealed cavity.

Figure 2:
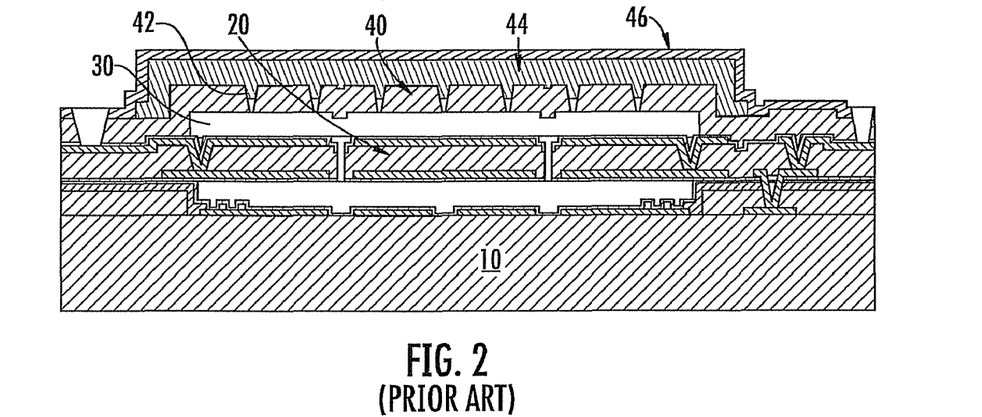

Many MEMS applications require higher pressures for proper operation, however, than can be achieved with this method. For example and referring to FIG. 2, if initial sealing is performed at or near atmospheric pressure using spin-on organic, glass, or similar materials, a third layer 46, a barrier layer, must be added to provide the required hermeticity. This is usually a vacuum deposited layer similar to that used for the single sealing layer approach. The initial sealing layer, second layer 44, maintains the pressure inside the cavity during the deposition. Third layer 46 generally consists of a dielectric material that is used to form the hermetic seal. The thicknesses of sealing layer 44 and barrier layer 46 are typically 1-5 μm and 1.5-4 μm, respectively. It is noted that in FIG. 2, MEMS device 20 is fabricated in a cavity on the device wafer. The cavity can be formed by etching a substrate 10 or depositing materials (e.g., silicon, oxide, glass) around MEMS device 20 followed by Chemical-Mechanical Planarization (CMP).

Because the film deposition is conducted at elevated temperatures and the thin film encapsulation is heterogeneous in nature, extrinsic thermal stress will typically be generated in the films after the film deposition process. The stresses are a function of geometry (e.g., length, thickness), material properties (e.g., Young's modulus, Poisson's ratio, and CTE), and processing conditions (e.g., temperatures, pressures). These stresses can occur at high levels in the as-deposited thin film encapsulation, which can cause defects in the film, such as delamination, cracks, moisture absorption, or the like. In particular, high tensile thermal stress often occurs at the edge of the third dielectric layer, which can result in cracks. In fact, finite element analyses have shown that a maximum tensile stress can be around 460 MPa, which is significantly large. This thermal stress is induced by the CTE mismatch between the third dielectric layer and the second polymer layer deposited/patterned outside the perimeter of the encapsulation. Further, if the sealing material is a polymer, it can adsorb moisture through defects (e.g., cracks, pores) in the barrier layer, which can result in degradation of the polymer and water vapor transmission to the MEMS devices. Accordingly, improved designs and methods for wafer-level thin film encapsulation for MEMS packaging would be desirable to minimize or eliminate the detrimental effects caused by these stresses.

SUMMARY

In accordance with this disclosure, devices and methods for wafer-level thin film encapsulation for MEMS devices are provided. In one aspect, an encapsulated microelectromechanical systems (MEMS) device is provided. The encapsulated MEMS device can include a MEMS device encapsulated by sacrificial material, a lid layer disposed (e.g., by deposition) over the sacrificial material, and a sealing layer over the etch holes. The lid layer can include a plurality of etch holes formed in the lid layer, the etch holes providing access to the sacrificial material through the lid layer for removal of the sacrificial material. The sealing layer can extend above the lid and prevent access to the etch holes. In addition, the encapsulated MEMS device can further include a barrier layer deposited over the lid layer and the sealing layer.

In another aspect, an encapsulated MEMS device can include a MEMS device encapsulated by sacrificial material, a lid layer over the sacrificial material, a sealing layer over the etch holes and defining a plurality of plugs corresponding to the plurality of etch holes, a metal layer over the sealing layer, and a barrier layer over the lid layer, the sealing layer, and the metal layer. The lid layer can include a plurality of etch holes patterned in the lid layer, the etch holes providing access to the sacrificial material through the lid layer for removal of the sacrificial material. Each of the plurality of plugs can at least partially fill a corresponding etch hole and extend above the top surface of the lid layer and outside the periphery of the etch hole to prevent access to the etch hole.

In another aspect, a method for encapsulating a MEMS device is provided. The method can include encapsulating a MEMS device with sacrificial material, covering the sacrificial material with a lid layer, forming a plurality of etch holes in the lid layer, removing the sacrificial material through the etch holes, covering the etch holes with a sealing layer, and patterning the sealing layer to define a plurality of plugs corresponding to the plurality of etch holes. The sealing layer can extend above the lid and prevent access to the etch holes.

Some of the aspects of the subject matter disclosed herein having been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which.

DETAILED DESCRIPTION

The present subject matter provides devices and methods for wafer-level thin film encapsulation for MEMS devices and packaging. Such encapsulation is particularly suited for surface micromachined MEMS devices, for example, although it can be applied to MEMS devices generally. For a surface micromachined device, the surface micromachining process can be a conformal process based on an isolated, patterned lower sacrificial layer upon which MEMS device layers are deposited and patterned, this lower sacrificial layer allowing the device to be released from the substrate.

Figure 3:
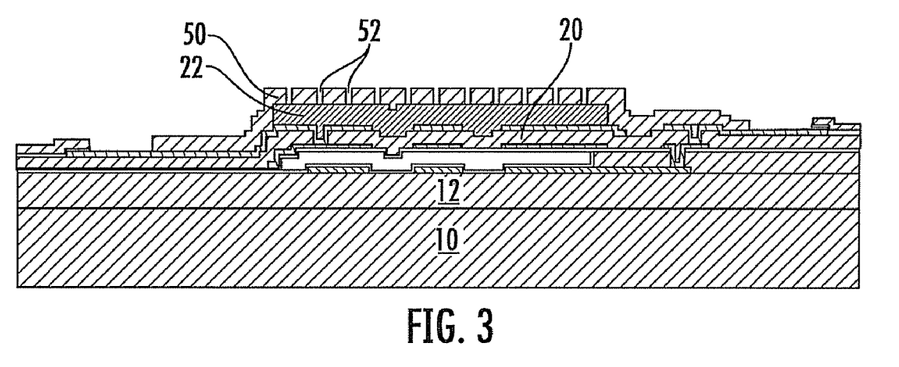
FIG. 3 is a schematic side view of a step in a process of encapsulating a MEMS device according to the presently disclosed subject matter.

The completed MEMS device formed by these device layers, generally designated 20 in FIGS. 3 through 11, can be encapsulated further by a second, upper sacrificial layer 22 upon which the structural encapsulation layers can be deposited and patterned for the sacrificial release process (See, e.g., FIG. 3). This upper sacrificial layer 22 can be a metal (e.g., Cu, Mo), organic (e.g., polyimide, photoresist), inorganic dielectric (e.g., oxide), or semiconductor (e.g., amorphous silicon) depending on material compatibility. The upper sacrificial layer can be patterned locally to MEMS device 20 but can extend beyond MEMS device 20 and cover the top of MEMS device 20 to an extent that a lid layer 50 can be deposited over MEMS device 20 without touching MEMS device 20, or upper sacrificial layer 22 can be patterned only for electrical/mechanical anchoring of MEMS device 20. In either arrangement, upper sacrificial layer 22 can act as a platform for depositing the encapsulation layers without interacting with MEMS device 20.

Alternatively, the surface micromachining process can be based on a planarized flow that uses self-planarizing layers or chemical-mechanical polishing (CMP). The planarized flow can follow one of two general approaches. In a first approach, a lower sacrificial layer can be deposited, planarized, and patterned local to MEMS device 20. The lower sacrificial layer can next be covered by a thick planarization layer that can be planarized until the lower sacrificial layer is exposed.

Once the lower sacrificial layer is exposed, the layers that form MEMS device 20 can be deposited and patterned and encapsulated by upper sacrificial layer 22, which separates MEMS device 20 from lid layer 50 and other encapsulation layers. As shown in FIG. 3, structural lid layer 50 can be deposited over patterned sacrificial layer 22, patterned, and etched to provide access sacrificial layer 22 for its subsequent removal.

Figure 4:
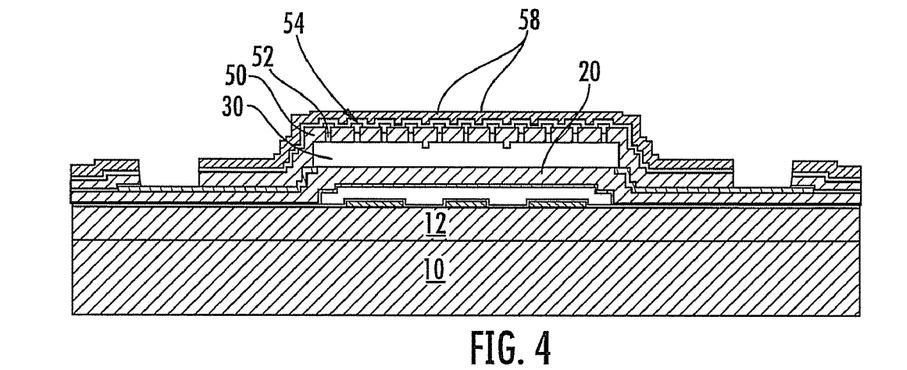
FIGS. 4 through 7 are schematic side view of configurations for a thin film encapsulation having discrete etch hole plugs according to the presently disclosed subject matter.

In a second approach, the planarization layer can be deposited, planarized, patterned, and etched to define a cavity in which the lower sacrificial layer can be deposited. The sacrificial material can be deposited and planarized (e.g. using CMP) to form the planarized platform on which to build MEMS device 20. Once the lower sacrificial layer is planarized, the layers that form MEMS device 20 can be deposited, patterned, and etched. These steps cab be followed by the deposition of upper sacrificial layer 22, which again separates MEMS device 20 from the encapsulation layers. Devices formed by both a conformal device process and a planarized device process are shown side-by-side in FIGS. 3 and 5. Further, FIG. 4 shows a device formed by a conformal device process, and FIGS. 6 and 7 show devices formed by planarized MEMS device processes.

The disclosed encapsulation process can also be applied to bulk micro-machined devices that are released and encapsulated by a sacrificial material, much like the encapsulation of a MEMS device by a polymer (e.g., polyimide or photoresist during a back-end coat-saw-strip process). The coating material can act as a sacrificial layer that can be patterned and processed upon. Subsequent encapsulation layers (i.e., lid structural material, sealing layer/plugs, cladding layer, and/or barrier layer) can be deposited on the sacrificial coating. In addition, the encapsulation process can be applied regardless of the specific form of MEMS device 20 (i.e., whether planarized or conformal), and thus it is understood that the above description of various methods for forming MEMS device 20 are provided merely as representative examples.

Regarding the formation of the structural encapsulation structure, referring to FIGS. 3 through 11, a structural lid layer 50 (e.g., about 2-4 µm thick) can be deposited over an upper sacrificial layer 22 that covers a MEMS device 20. Upper sacrificial layer 22 can be removed to create a cavity 30 above MEMS device 20. Lid layer 50 can be composed of a material such as silicon nitride, silicon dioxide, silicon oxynitride, polysilicon, or another material that can be deposited over a sacrificial material, patterned, and etched. Lid layer 50 can also be deposited over other areas of the underlying substrate 10 that are not covered by upper sacrificial layer 22. Lid layer 50 can be patterned and etched with a distribution of release etch holes 52, which can provide access to upper sacrificial layer 22 that encapsulates MEMS device 20. Thus, once the structure is completed, upper sacrificial layer 22 can be removed through etch holes 52 in lid layer 50 to define cavity 30.

Similarly to the surface micromachining process, the structural encapsulation process can likewise be a planarized or a conformal process. In general, the planarized process can have the same general approach as the similar process for MEMS device 20. Specifically, the planarized, wafer level encapsulation process can be processed using either of the first or second sacrificial layer approaches discussed above. If the second sacrificial layer approach is used, a cavity can be etched to form the sacrificial gap, and this etch can terminate on MEMS device 20. As is understood to those having skill in the art, this means that the cavity etch can be selective to the MEMS device layers or a selective etch stop layer will need to be used.

Figure 8:
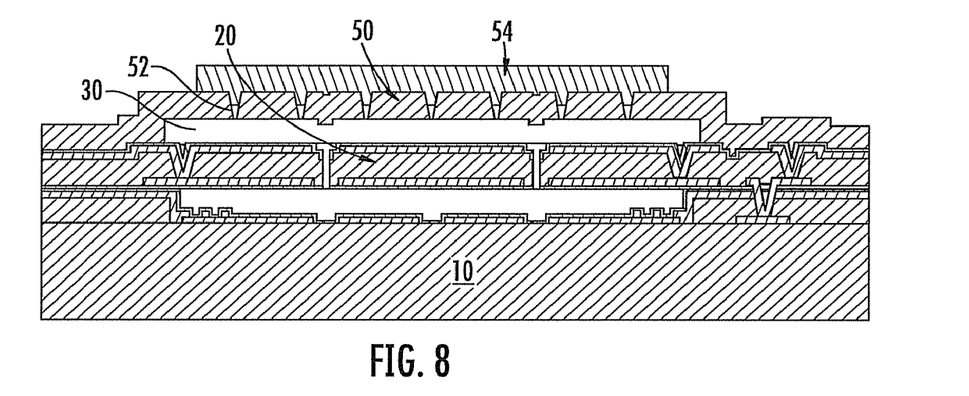
FIGS. 8 through 11 are schematic side view of configurations for a thin film encapsulation having a continuous sealing layer according to the presently disclosed subject matter.
Figure 9:
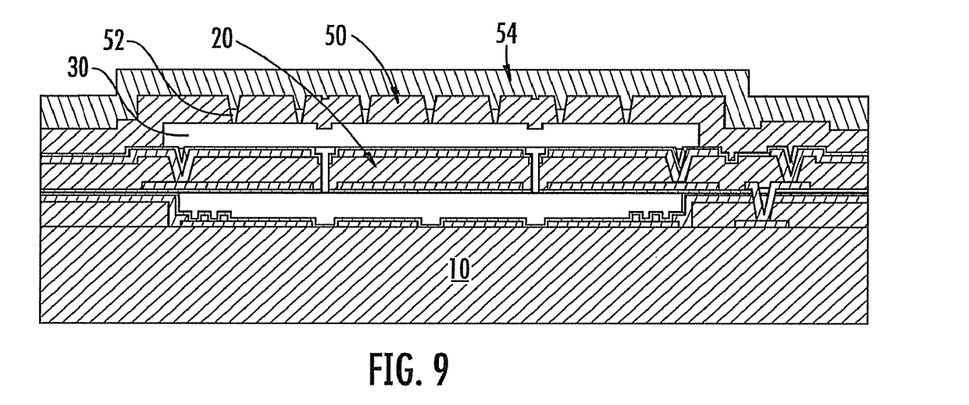
Figure 10:
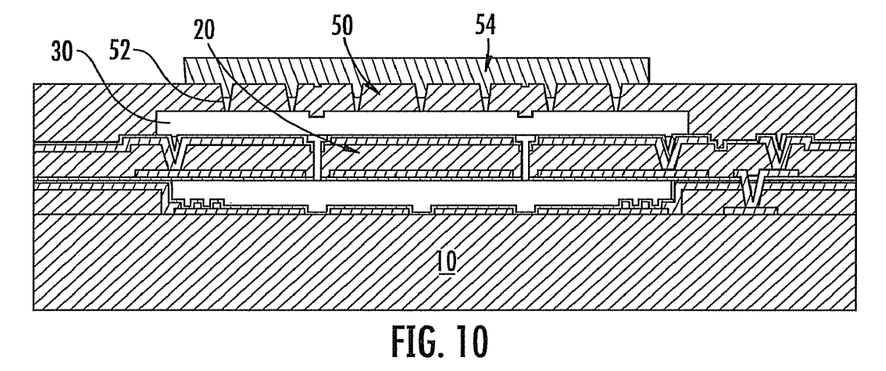
Figure 11:
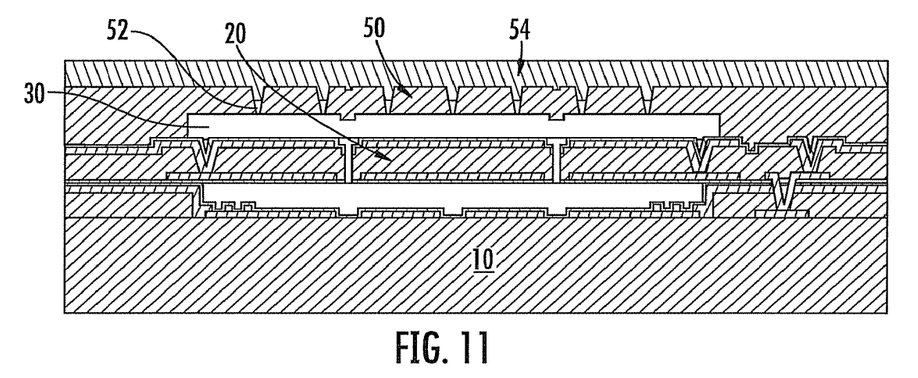

Examples of devices formed by a conformal encapsulation process are shown in FIGS. 8 and 9. FIG. 8 further shows that the edges of a sealing layer 54 can be patterned to lie between the edges of cavity 30 and the edges of etch holes 52 that are used to form cavity 30, and FIG. 9 further shows that sealing layer 54 can be unpatterned but can be formed from a low CTE material. Examples of devices formed by a planarized encapsulation process are shown in FIGS. 10 and 11. FIG. 11 further shows an unpatterned sealing layer 54, which again can have a low CTE. It is noted that sealing layer 54 is shown in FIGS. 8 through 11 as a single contiguous layer covering all of etch holes 52. As discussed below, however, sealing layer 54 can be further patterned or otherwise modified to reduce the amount of sealing material in the encapsulation structure, which can help alleviate the stresses that can develop.

Independent of the flow to make the MEMS device or the MEMS encapsulation, lid layer 50 can be perforated with an array of release etch holes 52 (e.g., about 1-3 μm diameter), which can be either regularly spaced (e.g., about 10-50 μm pitch) or irregularly spaced, for the removal of the sacrificial material under MEMS device 20 and the sacrificial material above MEMS device 20 and separating it from lid layer 50. The sacrificial layer can be removed by a dry or wet process, but the structure and formation of the encapsulation layers can be chosen independently of the particular sacrificial removal process used.

Following the removal of the sacrificial material through etch holes 52, etch holes 52 can be filled, for example by using a sealing layer 54 such as spin-on polymer (e.g., polyimide, benzocyclobutene (BCB), SiLK), spin-on glass, or other material that can be used to fill and plug etch holes 52. To help reduce tensile stresses formed in the thin film encapsulation, the material properties and thickness of sealing layer 54 can be selected to exhibit a particular thermomechanical behavior for a given change in temperature field. For instance, some material properties (e.g., Young's modulus, Poisson ratio, yield strength, CTE, stress free temperatures) can directly impact the thermal strain given the same deposition temperature and thus directly affect stress developed in the film. Further, a change in layer geometry (e.g., a thickness between about 1-5 μm) can change the local stiffness of the thin film encapsulation structure and thus decreases the tensile stress in subsequently-deposited layers.

In addition, at least portions of sealing layer 54 can be removed from the substrate except for the places where it seals etch holes 52, thus leaving an array of plugs corresponding to the array of etch holes 52, as shown in FIGS. 4-7. In this way, the plugs of sealing layer 54 prevent other materials from entering the MEMS devices cavity but do not completely cover the top surface of lid layer 50. In contrast, a typical approach to sealing etch holes is to coat the wafer with a layer of sealing material that may be patterned locally to the encapsulation but not to the holes. In this way, the sealing material forms a blanket layer over the entire lid layer. As noted above, this approach can lead to larger deformations and stresses in the barrier layer and interfacial stresses between the barrier and sealing layer, especially over large temperature swings during subsequent processing or environmental stresses. In contrast, by removing a large portion of the seal material outside etch holes 52, the detrimental effects caused by these deformations can be greatly reduced.

Etch holes 52 can be designed for optimal removal of the sacrificial layer (i.e., minimum time for no residual and minimum impact on the encapsulation structure), which can be affected by the size of etch holes 52 and the spacing or pitch of etch holes 52. The size of etch holes 52 can operate in conjunction with the properties (e.g., viscosity if a spin on material) of the material used for sealing layer 54 to prevent leak through of the of any seal material. For instance, the geometry of etch holes 52 can be designed so as to minimize leak-through, where the seal material could transport through etch holes 52 onto MEMS device 20, and prevent pull-out of the plugs of sealing layer 54 in cases where the plugs can be expelled from etch holes 52 singularly or in combination by stresses induced by temperature, pressure, or another force.

Figure 12:
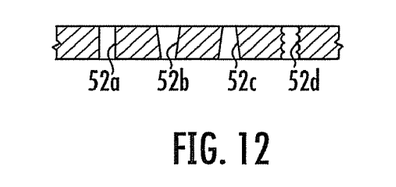
FIG. 12 is a schematic side view of various etch hole geometries for use with a thin film encapsulation according to the presently disclosed subject matter.

Examples of such geometries are shown in FIG. 12 and can include straight-sided holes 52*a*, tapered holes 52*b* or 52*c*, or scalloped or otherwise roughened holes 52*d*. In particular, a tapered hole can be a negatively-tapered hole 52*b* (i.e., hole diameter decreases through the thickness), which can help minimize leak-through, or a positively-tapered hole 52*c* (i.e., hole diameter increases through the thickness), which can help prevent pull-out. With regard to scalloped holes 52*d*, the hole sidewalls can be characterized by a highly random or systematic roughness that is a result of the processing that can help to minimize both leak-through and pull-out.

Figure 13:
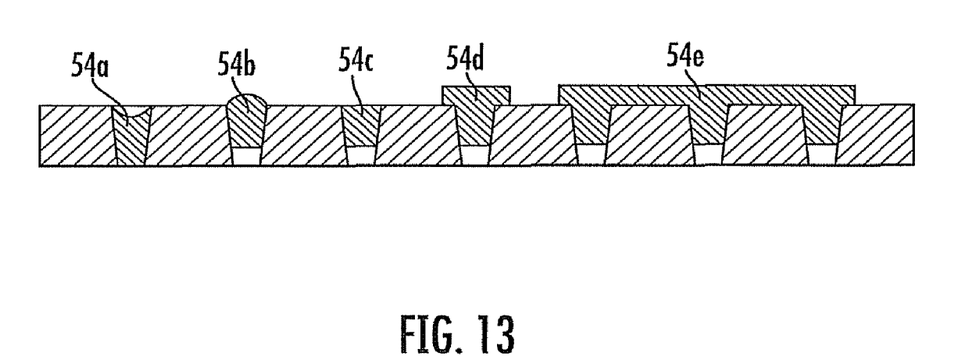
FIG. 13 is a schematic side view of various etch hole plug geometries for use with a thin film encapsulation according to the presently disclosed subject matter.

In combination with the geometry of etch holes 52, different designs for plug geometries can further enhance the performance of the encapsulation layers. For example, the plugs of sealing layer 54 can have any of a variety of geometries shown in FIG. 13, including recessed plugs 54*a* (i.e., characterized by a slight concavity of the plug surface), protruded plugs 54*b* (i.e., slightly convex surface that extends above the top surface of lid layer 50), flush plugs 54*c* (i.e., having a surface coplanar with the top surface of lid layer 50), overplot plugs 54*d* (i.e., extending a distance above the top surface of lid layer 50 and a distance outside the periphery of etch hole 52), or meshed plugs 54*e* (i.e., defining a meshed pattern of seal material to plug etch holes 52 and to further anchor sealing layer 54 to lid layer 50). Further, the bottom surface of the plugs (i.e., adjacent cavity 30 formed by the removal of the upper sacrificial layer) can be recessed, protruded, or flush relative to the bottom surface of lid layer 50.

Plugs having a recessed, protruded, or flush geometry can be anchored to the hole sidewall, whereas overplot and meshed plugs are also anchored to structural lid layer 50 and any cladding and/or barrier layers deposited on top of lid layer 50 and sealing layer 54. Accordingly, the design of the plugs of sealing layer 54 can be selected to balance the sealing capacity of an overplot or meshed plug design against the smaller material requirement of a recessed, flush, or protruded design. For example, a plug of sealing layer 54 can have an overplot design but with a minimum positive overplot. Stated otherwise and referring to FIG. 13, a portion of a plug 54*d* can extend beyond the profile of a given etch hole 52 by a small amount (e.g., less than about 5 82 m) that is still sufficient to help prevent pull-through but not so much as to detrimentally increase the likelihood that temperature and humidity cycling can weaken the lid integrity. In such a configuration, the periphery area of the overplot plug can aid with the adhesion of the plug to lid layer 50 while still minimizing the total volume and area of seal material. This design thus provides a good compromise between minimizing the amount of initial sealant and maintaining sufficient adhesion between the plugs of sealing layer 54 and lid layer 50 during the final sealing depositions, especially given process variations.

In addition, a metal layer 56 can be deposited and patterned so that it covers and/or encloses sealing layer 54. Metal layer 56 can provide additional sealing, cladding, or it can serve as a barrier or an additional electrical interconnect layer. In one arrangement, metal layer 56 can be deposited over each plug of sealing layer 54 separately (i.e., individual metal layers isolated from each other), the extent of metal layer 56 being at least greater than the size of respective plugs so that it adheres to sealing layer 54 and to structural lid layer 50. Alternatively, metal layer 56 can be deposited and patterned as a contiguous sheet that encapsulates the full array of plugs formed by sealing layer 54.

Further, a barrier layer 58 can cover the whole encapsulation structure, including lid layer 50, sealing layer 54 (e.g., plugs), and any metal layer 56 that covers the sealed etch holes 52. Barrier layer 58 can consist of thin-film deposited pin-hole-free materials, can be a single layer or a multilayer composite structure formed from one or more materials (e.g., metals, semiconductors, dielectrics), and can be resistant to water vapor transmission. For example, barrier layer 58 can be a passivation layer (e.g., between about 1.5-4 µm thick) such as silicon nitride, a bilayer of silicon oxide and silicon nitride, or another material barrier. Barrier layer 58 can be patterned for electrical access to bond or flip-chip pads. The thickness of barrier layer 58 can selected to help achieve a low level tensile stress in the thin film encapsulation.

Figure 5:
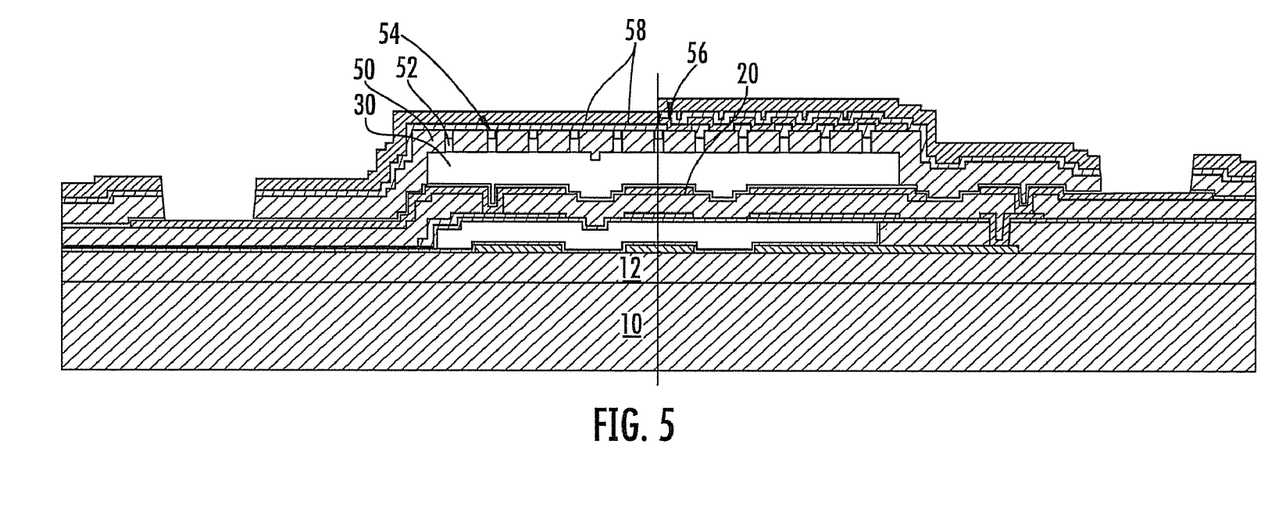
Figure 6:
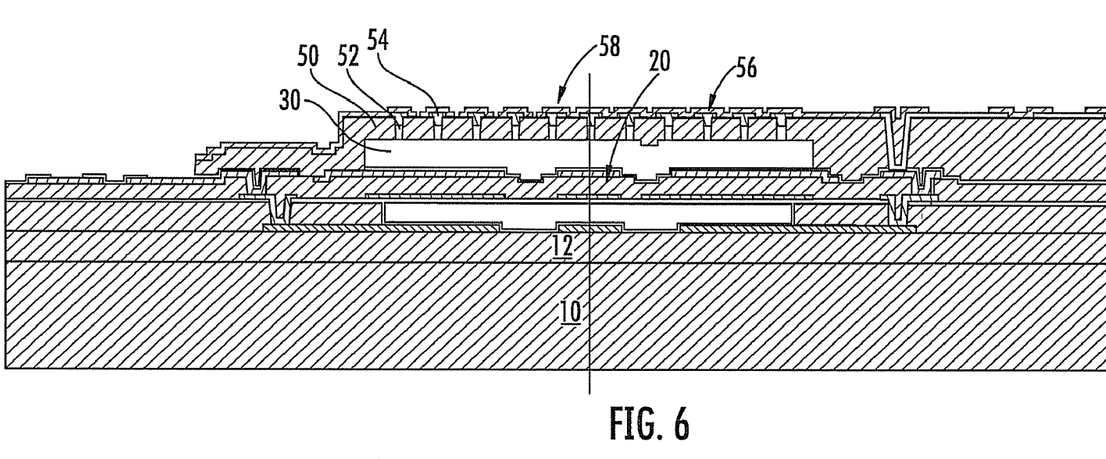
Figure 7:
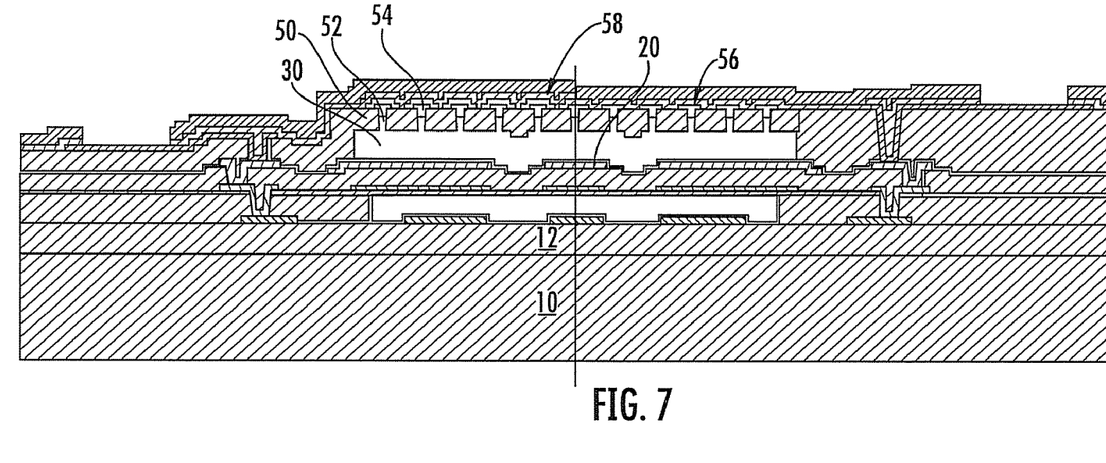

Various arrangements of the elements described hereinabove are shown in FIGS. 4-7. For instance, referring to FIG. 4, a conformal beam design is shown. MEMS device 20 is formed above a substrate layer 12 (e.g., a wafer with CMOS circuitry) on top of a device handle 10. A conformal beam having a conformal lid is formed over MEMS device 20. A sealing layer 54 in the form of overplot plugs seals etch holes 52, and a multilayer barrier 58 covers sealing layer 54. In FIG. 5, both a conformal beam design (left side) and a planar beam design (right side) are shown side-by-side. The conformal beam shown in FIG. 5 differs from that shown in FIG. 4 in that the plugs of sealing layer 54 are flush to the top surface of lid layer 50. The planar beam is formed with a conformal lid, overplot plugs, and a metal layer 56 positioned over sealing layer 54 in a continuous/meshing arrangement.

FIGS. 6 and 7 illustrate planar devices having either conformal or planar lids shown side-by-side. Specifically, the left portion of FIG. 6 shows a planar device having a conformal lid layer 50, overplot plugs, and a single layer barrier layer 58. The right portion of FIG. 6 shows a planar device with a planar lid layer 50, flush plugs, isolated metal layers 56, and a single layer barrier 58. FIG. 7 is similar in that both conformal and planar lid layers 50 are shown. The left portion shows a planar device having a conformal lid layer 50, overplot plugs, isolated metal layers 56, and a multilayer barrier 58, whereas the right portion shows a planar device with a planar lid layer 50, flush plugs, isolated metal layers 56, and a multilayer barrier 58.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

What is claimed is:

1. An encapsulated microelectromechanical (MEMS) device comprising:
   a MEMS device encapsulated by sacrificial material;
   a lid layer over the sacrificial material, the lid layer including a plurality of etch holes formed in the lid layer, the etch holes providing access to the sacrificial material through the lid layer for removal of the sacrificial material; and
   a sealing layer over the etch holes and defining a plurality of plugs corresponding to the plurality of etch holes, the sealing layer extending above the lid and preventing access to the etch holes.

2. The encapsulated MEMS device of claim 1, wherein the etch holes have a negative taper.

3. The encapsulated MEMS device of claim 1, wherein the sealing layer at least partially fills the etch holes.

4. The encapsulated MEMS device of claim 1, wherein each of the plurality of plugs extends above the top surface of the lid layer and outside the periphery of a corresponding etch hole.

5. The encapsulated MEMS device of claim 1, further comprising a metal layer over the sealing layer.

6. The encapsulated MEMS device of claim 5, wherein the metal layer comprises isolated metal layers each positioned over one of the etch holes.

7. The encapsulated MEMS device of claim 5, wherein the metal layer comprises a contiguous sheet covering all of the etch holes.

8. The encapsulated MEMS device of claim 1, further comprising a barrier layer over the lid layer and the sealing layer.

9. The encapsulated MEMS device of claim 8, wherein the barrier layer comprises a single layer.

10. The encapsulated MEMS device of claim 8, wherein the barrier layer comprises a multilayer composite.

11. An encapsulated microelectromechanical (MEMS) device comprising:
    a MEMS device encapsulated by sacrificial material;
    a lid layer over the sacrificial material, the lid layer including a plurality of etch holes formed in the lid layer, the etch holes providing access to the sacrificial material through the lid layer for removal of the sacrificial material;
    a sealing layer over the etch holes and defining a plurality of plugs corresponding to the plurality of etch holes, each of the plurality of plugs at least partially filling a corresponding etch hole and extending above the top surface of the lid layer and outside the periphery of the etch hole to prevent access to the etch hole;
    a metal layer over the sealing layer; and
    a barrier layer over the lid layer, the sealing layer, and the metal layer.

12. The encapsulated MEMS device of claim 11, wherein the metal layer comprises isolated metal layers each positioned over one of the etch holes.

13. The encapsulated MEMS device of claim 11, wherein the metal layer comprises a contiguous sheet covering all of the etch holes.

14. The encapsulated MEMS device of claim 11, wherein the barrier layer comprises a single layer.

15. The encapsulated MEMS device of claim 11, wherein the barrier layer comprises a multilayer composite.

16. A method for encapsulating a microelectromechanical (MEMS) device comprising:
    encapsulating a MEMS device with sacrificial material;
    covering the sacrificial material with a lid layer;
    forming a plurality of etch holes in the lid layer, the etch holes providing access to the sacrificial material through the lid layer;
    removing the sacrificial material through the etch holes;
    covering the etch holes with a sealing layer, the sealing layer extending above the lid and preventing access to the etch holes; and
    patterning the sealing layer to define a plurality of plugs corresponding to the plurality of etch holes.

17. The method of claim 16, wherein covering the etch holes with a sealing layer comprises at least partially filling the etch holes with the sealing layer.

18. The method of claim 16, wherein patterning the sealing layer comprises creating plugs that extend above the top surface of the lid layer and outside the periphery of a corresponding etch hole.

19. The method of claim 16, further comprising covering the sealing layer with a metal layer.

20. The method of claim 19, wherein the metal layer comprises isolated metal layers each positioned over one of the etch holes.

21. The method of claim 19, wherein the metal layer comprises a contiguous sheet covering all of the etch holes.

22. The method of claim 16, further comprising covering the lid layer and the sealing layer with a barrier layer.

23. The method of claim 22, wherein the barrier layer comprises a single layer.

24. The method of claim 22, wherein the barrier layer comprises a multilayer composite.

* * * * *